United States Patent
Ha et al.

(10) Patent No.: US 12,412,613 B2
(45) Date of Patent: Sep. 9, 2025

(54) ENERGY-EFFICIENT MEMORY FOR CRYOGENIC COMPUTING

(71) Applicant: SHANGHAITECH UNIVERSITY, Shanghai (CN)

(72) Inventors: Yajun Ha, Shanghai (CN); Yuhao Shu, Shanghai (CN); Hongtu Zhang, Shanghai (CN)

(73) Assignee: SHANGHAITECH UNIVERSITY, Shanghai (CN)

( * ) Notice: Subject to any disclaimer, the term of this patent is extended or adjusted under 35 U.S.C. 154(b) by 162 days.

(21) Appl. No.: 18/505,128

(22) Filed: Nov. 9, 2023

(65) Prior Publication Data

US 2024/0233796 A1    Jul. 11, 2024

Related U.S. Application Data

(63) Continuation of application No. PCT/CN2023/083273, filed on Mar. 23, 2023.

(30) Foreign Application Priority Data

Jan. 6, 2023  (CN) .......................... 202310016205.8

(51) Int. Cl.
    *G11C 11/402*   (2006.01)
    *G11C 11/408*   (2006.01)
    (Continued)

(52) U.S. Cl.
    CPC ...... *G11C 11/4023* (2013.01); *G11C 11/4087* (2013.01); *G11C 11/4091* (2013.01); *G11C 11/4096* (2013.01)

(58) Field of Classification Search
    CPC .......................................... G11C 11/401–4099
    See application file for complete search history.

(56) References Cited

U.S. PATENT DOCUMENTS 6,385,122 B1    5/2002  Chang
2017/0294221 A1* 10/2017  Giterman ................ G11C 11/41

FOREIGN PATENT DOCUMENTS

| CN | 205656856 U | 10/2016 |
| CN | 108349725 A | 7/2018 |
| CN | 111627476 A | 9/2020 |

OTHER PUBLICATIONS

Ganapathy et al., A Novel Variation-Tolerant 4T-DRAM Cell With Enhanced Soft-Error Tolerance, 2012 (Year: 2012).*

(Continued)

*Primary Examiner* — Alfredo Bermudez Lozada
(74) *Attorney, Agent, or Firm* — Bayramoglu Law Offices LLC

(57) ABSTRACT

An energy-efficient memory for cryogenic computing is provided. The energy-efficient memory includes a plurality of memory banks, where each of the memory banks includes a cryogenic semi-static, dual-port, boost-free gain cell (CSDB-GC) macro module, a universal address decoder, and a different address decoder. The CSDB-GC macro module includes a plurality of columns of local blocks, and each of the local blocks includes a plurality of CSDB-GC memory cells. A final measurement result of a 16 Kb CSDB-eDRAM shows that the 16 Kb CSDB-eDRAM achieves data retention time (DRT) of 16.67 seconds, which is 2.6 times longer than DRT of a state-of-the-art cryogenic eDRAM at a temperature of 4.2 K, and achieves lower refresh power (0.11 pW/Kb). In addition, the 16 Kb CSDB-eDRAM also achieves shorter access time, namely, 710 ps (1.41 GHz). Compared with the state-of-the-art work, the 16 Kb CSDB-eDRAM has a lowest dynamic power consumption overhead, namely, 49.23 uW/Kb.

4 Claims, 7 Drawing Sheets

(51) Int. Cl.
  *G11C 11/4091* (2006.01)
  *G11C 11/4096* (2006.01)

(56) References Cited

OTHER PUBLICATIONS

Ganapathy et al. (Year: 2012).*
Dongmoon Min, et al., CryoCache: A Fast, Large, and Cost-Effective Cache Architecture for Cryogenic Computing, ASPLOS '20, 2020, pp. 449-464.
Ilkwon Byun, et al., CryoCore: A Fast and Dense Processor Architecture for Cryogenic Computing, 2020 ACM/IEEE 47th Annual International Symposium on Computer Architecture (ISCA), 2020, pp. 335-348.
Rakshith Saligram, et al., CryoMem: A 4K-300K 1.3GHz eDRAM Macro with Hybrid 2T-Gain-Cell in a 28nm Logic Process for Cryogenic Applications, IEEE CICC 2021/ Session 22: Circuits for Machine Learning and cryo-CMOS Applications/ Paper 22-4.
Dinesh Somasekhar, et al., 2 GHZ 2 Mb 2T Gain Cell Memory Macro With 128 GBytes/sec Bandwidth in a 65 nm Logic Process Technology, IEEE Journal of Solid-State Circuits, 2009, pp. 174-185, vol. 44, No. 1.
Ki Chul Chun, et al., A 3T Gain Cell Embedded DRAM Utilizing Preferential Boosting for High Density and Low Power On-Die Caches, IEEE Journal of Solid-State Circuits, 2011, pp. 1495-1505, vol. 46, No. 6.
Robert Giterman, et.al, A 4-Transistor nMOS-Only Logic-Compatible Gain-Cell Embedded DRAM With Over 1.6-ms Retention Time at 700 mV in 28-nm FD-SOI, IEEE Transactions on Circuits and Systems-I: Regular Papers, pp. 1-12.
Robert Giterman, et.al, An 800-MHz Mixed-VT 4T IFGC Embedded DRAM in 28-nm CMOS Bulk Process for Approximate Storage Applications, IEEE Journal of Solid-State Circuits, 2018, pp. 1-13.
Yuanke Zhang, et al., Hot Carrier Degradation in MOSFETs at Cryogenic Temperatures Down to 4.2 K, IEEE Transactions on Device and Materials Reliability, 2021, pp. 620-626, vol. 21, No. 4.
J. R. Hoff, et al., Cryogenic Lifetime Studies of 130 nm and 65 nm nMOS Transistors for High-Energy Physics Experiments, IEEE Transactions on Nuclear Science, 2015, pp. 1255-1261, vol. 62, No. 3.

* cited by examiner

|  | hold | write 0/1 | read 0/1 |
|---|---|---|---|
| WLn | 0 | 1 | V1 |
| WLp | 1 | 0 | V2 |
| BLn | 0 | 0/1 | 0/ΔV |
| BLp | 1 | 1/0 | 1/1-ΔV |

| CHIP SUMMARY | |
|---|---|
| Technology | 40nm CMOS |
| Die Area | 2.24 mm$^2$ |
| Macro Size | 16 Kbit |
| Cell Topology | 4T CSDB-GC |
| Cell Area | 0.557 um$^2$ |
| Support Mode | Single/Dual Read |
| Temperature | 4.2 K – 300 K |
| Operating $V_{DD}$ | 0.7 V – 1.1 V |
| Min. DRT | 1.2 us @300K<br>16.67 s @4.2K |
| Retention Power | 36.07 uW @300K<br>1.75 pW @4.2K |
| Dynamic Power | 963.94 uW @300K<br>787.68 uW @4.2K |

|  | Somasekhar [4] | Chun [5] | Giterman [6] | Saligram [3] | This Work |
|---|---|---|---|---|---|
| Technology | 65 nm | 65 nm | 28 nm | 28 nm | 40 nm |
| Supply Voltage | 1.1 V | 1.2 V | 0.7 V | 0.9 V | 1.1 V |
| Temperature | ~ 300 K | | | | 4.2 K – 300 K |
| Cell Size (um$^2$) | 0.275 | 0.627 | 0.23 | 0.57 | 0.557 |
| Dual-port Read | No | No | No | No | Yes |
| Freq. (MHz) | 250 | 500 | N/R | 1300 | 1410* |
| Retention Time | 10 us | 1250 us | 1691 us | 2.4 us 6.5*s | **1.2 us 16.67*s** |
| Retention Power per Kb | N/R | N/R | 7.17 nW | N/R | **2.25 uW 0.11*pW** |
| Dynamic Power per Kb | N/R | N/R | N/R | 760 uW 560*uW | **60.25 uW 49.23*uW** |

N/R: Not Reported   * Results at 4.2K

FIG. 6

ENERGY-EFFICIENT MEMORY FOR CRYOGENIC COMPUTING

CROSS REFERENCE TO THE RELATED APPLICATIONS

This application is a continuation application of International Application No. PCT/CN2023/083273, filed on Mar. 23, 2023, which is based upon and claims priority to Chinese Patent Application No. 202310016205.8, filed on Jan. 6, 2023, the entire contents of which are incorporated herein by reference.

TECHNICAL FIELD

The present disclosure relates to a circuit design of a cryogenic energy-efficient memory.

BACKGROUND

The complementary metal-oxide-semiconductor transistor (CMOS) in a cryogenic environment[1]-[2] presents almost ideal performance, which further promotes the development of cryogenic applications. As a promising solution for pursuing a circuit with higher performance and energy efficiency, cryogenic computing has also received considerable attention in recent years. For a cryogenic computing application, a key issue is to design a high-density, high-capacity, and energy-efficient memory at a cryogenic temperature. Among different memory topologies, a gain-cell embedded dynamic random access memory (GC-eDRAM) has become an attractive candidate solution[3]-[7] for implementing a cryogenic on-chip memory due to its process compatibility, high density, and low-power operations.

However, a cryogenic energy-efficient memory system built based on an eDRAM still faces following challenges: 1. It is not clear how to store full-swing data to achieve longer data retention time (DRT) and lower retention power. For example, in a conventional eDRAM design, a wordline voltage boosting scheme[3]-[5] is usually used to ensure a good '1' or '0' written into bitcell. However, a threshold voltage increases as a temperature decreases, making the wordline voltage boosting scheme less effective at the cryogenic temperature and even affecting a device lifespan[8]-[9]. 2. In the early eDRAM research, two unrelated access ports are respectively used to separate read and write operations. This scheme reduces data leakage of a memory node, but cannot achieve a high-performance dual-port read operation or meet a data bandwidth requirement in a data-intensive application. In addition, the unbalance speed of dual-port operation further hinders improvement of read performance. 3. A high-power operation of the circuit will greatly increase a cooling cost of a cryogenic system, especially for frequent read and write operations in a high-density and high-capacity memory. A power consumption of the memory system has a greater impact on cooling of the cryogenic system. In other words, implementing a memory with a lower energy consumption overhead will be much more friendly to the cooling system.

CITED REFERENCES

[1] D. Min, I. Byun, G.-H. Lee, S. Na, and J. Kim, "Cryocache: A fast, large, and cost-effective cache architecture for cryogenic computing," in Proceedings of the Twenty-Fifth International Conference on Architectural Support for Programming Languages and Operating Systems, ser. ASPLOS '20. New York, NY, USA: Association for Computing Machinery, March 2020, p. 449-464.

[2] I. Byun, D. Min, G.-h. Lee, S. Na, and J. Kim, "Cryocore: A fast and dense processor architecture for cryogenic computing," in 2020 ACM/IEEE 47th Annual International Symposium on Computer Architecture (ISCA), May 2020, pp. 335-348.

[3] R. Saligram, S. Datta, and A. Raychowdhury, "Cryomem: A 4 k-300 k 1.3 ghz edram macro with hybrid 2t-gain-cell in a 28 nm logic process for cryogenic applications," in 2021 IEEE Custom Integrated Circuits Conference (CICC), April 2021, pp. 1-2.

[4] D. Somasekhar, Y. Ye, P. Aseron, S.-L. Lu, M. M. Khellah, J. Howard, G. Ruhl, T. Karnik, S. Borkar, V. K. De, and A. Keshavarzi, "2 ghz 2 mb 2 t gain cell memory macro with 128 gbytes/see bandwidth in a 65 nm logic process technology," IEEE Journal of Solid-State Circuits, vol. 44, no. 1, pp. 174-185, January 2009.

[5] K. C. Chun, P. Jain, J. H. Lee, and C. H. Kim, "A 3 t gain cell embedded dram utilizing preferential boosting for high density and low power ondie caches," IEEE Journal of Solid-State Circuits, vol. 46, no. 6, pp. 1495-1505, June 2011.

[6] R. Giterman, A. Fish, A. Burg, and A. Teman, "A 4-transistor nmos-only logic-compatible gain-cell embedded dram with over 1.6-ms retention time at 700 mv in 28-nm fd-soi," IEEE Transactions on Circuits and Systems I: Regular Papers, vol. 65, no. 4, pp. 1245-1256, April 2018.

[7] A. Fish, N. Geuli, E. Mentovich, A. Burg, and A. Teman, "An 800-mhz mixed-vt 4 t ifgc embedded dram in 28-nm cmos bulk process for approximate storage applications," IEEE Journal of SolidState Circuits, vol. 53, no. 7, pp. 2136-2148, July 2018.

[8] Y. Zhang, J. Xu, T.-T. Lu, Y. Zhang, C. Luo, and G. Guo, "Hot carrier degradation in mosfets at cryogenic temperatures down to 4.2 k," IEEE Transactions on Device and Materials Reliability, vol. 21, no. 4, pp. 620-626, December 2021.

[9] J. R. Hoff, G. W. Deptuch, G. Wu, and P. Gui, "Cryogenic lifetime studies of 130 nm and 65 nm nmos transistors for high-energy physics experiments," IEEE Transactions on Nuclear Science, vol. 62, no. 3, pp. 1255-1261, June 2015.

SUMMARY

The present disclosure is intended to provide a memory with a lower energy consumption overhead.

In order to achieve the foregoing objective, technical solutions of the present disclosure provide an energy-efficient memory for cryogenic computing, including a plurality of memory banks, where each of the memory banks includes a cryogenic semi-static, dual-port, boost-free gain cell (CSDB-GC) macro module, a universal address decoder, and a different address decoder, where the CSDB-GC macro module includes a plurality of columns of local blocks, where all local blocks in a same column share a same global bitline n (GBLn), a same global bitline p (GBLp), and two sense amplifiers (SAs) connected to the GBLn and the GBLp, each local block includes a plurality of CSDB-GC memory cells, all CSDB-GC memory cells of a same local block are connected to a local bitline n (LBLn) and a local bitline p (LBLp), different local blocks have different LBLns and LBLps, each LBLn is connected to the GBLn through a corresponding bitline switch SWn, each LBLp is connected to the GBLp through a corresponding bitline switch SWp, and the SWn and the SWp are controlled to be closed to select a corresponding local block in a column, such that an LBLn and an LBLp of the selected local block are connected to the GBLn and the GBLp respectively;

a wordline n (WLn) of each CSDB-GC memory cell is directly connected to the universal address decoder, a wordline p (WLp) is selectively connected to the universal address decoder or the different address decoder based on control logic, the different address decoder is activated only when two different data addresses are received, the universal address decoder is activated to implement a single-port read operation of the CSDB-GC memory cell, and the different address decoder is activated to implement a dual-port read operation of the CSDB-GC memory cell, and each CSDB-GC memory cell includes dual ports that are provided by an n-type access transistor N1 and a p-type access transistor P1, and an internal data regeneration loop constituted by an n-type transistor N2 and a p-type transistor P2; a bitline n (BLn) connected to the n-type access transistor N1 and a bitline p (BLp) connected to the p-type access transistor P1 are respectively connected to the LBLn and the LBLp, the WLn is connected to the n-type access transistor N1, and the WLp is connected to the p-type access transistor P1; during a write operation, data 0 or 1 is written into a node Vn through the n-type access transistor N1, and the data 1 or 0 is written into a node Vp through the p-type access transistor P1; when the n-type access transistor N1 transmits a weak signal '1' to the node Vn or the p-type access transistor P1 transmits a weak signal '0' to the node Vp, the weak signal '1' or the weak signal '0' enables the n-type transistor N2 and the p-type transistor P2 to be turned on, the node Vn is connected to a VDD through the p-type transistor P2, and the node Vp is connected to a GND through the n-type transistor N2, where the weak signal '1' represents a voltage lower than the VDD and the weak signal '0' represents a voltage higher than the GND; and during a read operation, the n-type access transistor N1 and/or the p-type access transistor P1 are/is turned on to read data stored in the node Vn and/or the node Vp, and when voltages of the node Vn and the node Vp experience a disturbance, the n-type transistor N2 and the p-type transistor P2 are turned on, allowing the node Vn and the node Vp to be connected to the VDD and the GND respectively.

Preferably, statuses of the bitline switches SWn and SWp are controlled through two most significant bits of a data address, such that a corresponding local block in a column is selected.

Preferably, voltages of the BLn and the BLp in a retention mode are set to the GND and the VDD, respectively.

Preferably, during the read operation, the WLn is charged to a V1 to turn on the n-type access transistor N1, the WLp is charged to a V2 to turn on the p-type access transistor P1, and the voltages V1 and V2 of the wordlines are adjusted during the read operation to achieve wordline voltage off-chip tuning for the read operation.

Compared with the prior art, the present disclosure has following innovative points:

1) Design of a cryogenic 4 T memory cell (CSDB-GC) with long retention time (RT): The present disclosure provides the 4 T CSDB-GC design to significantly increase RT without any wordline voltage boosting scheme, and support the dual-port read operation to obtain a higher data bandwidth at a temperature of 4.2 K.

2) Cryogenic voltage tuning technology for the read wordline. The present disclosure develops a wordline voltage off-chip tuning method for the read operation to achieve higher read performance by reducing an unbalance speed of the dual ports and ensuring a dual-port operation without read disturbance at the temperature of 4.2 K.

3) Cryogenic bitline segmentation technology: The present disclosure uses a cryogenic bitline segmentation scheme to optimize power consumption overheads and access performance of different access operations at the temperature of 4.2 K by dividing a heavy load of a bitline into a plurality of local blocks.

BRIEF DESCRIPTION OF THE DRAWINGS

FIG. 6 compares the present disclosure and existing eDRAM designs.

DETAILED DESCRIPTION OF THE EMBODIMENTS

The present disclosure will be further described below with reference to specific embodiments. It should be understood that these embodiments are only intended to describe the present disclosure, rather than to limit the scope of the present disclosure. In addition, it should be understood that various changes and modifications may be made on the present disclosure by those skilled in the art after reading the content of the present disclosure, and these equivalent forms also fall within the scope defined by the appended claims of the present disclosure.

An embodiment discloses a design of a 16 Kb cryogenic, semi-static, and dual-port eDRAM (CSDB eDRAM) without wordline voltage boosting. The design has completed tests on a 40 nanometer CMOS process tape-out and the chip at a temperature of 4.2 K.

Figure 1:
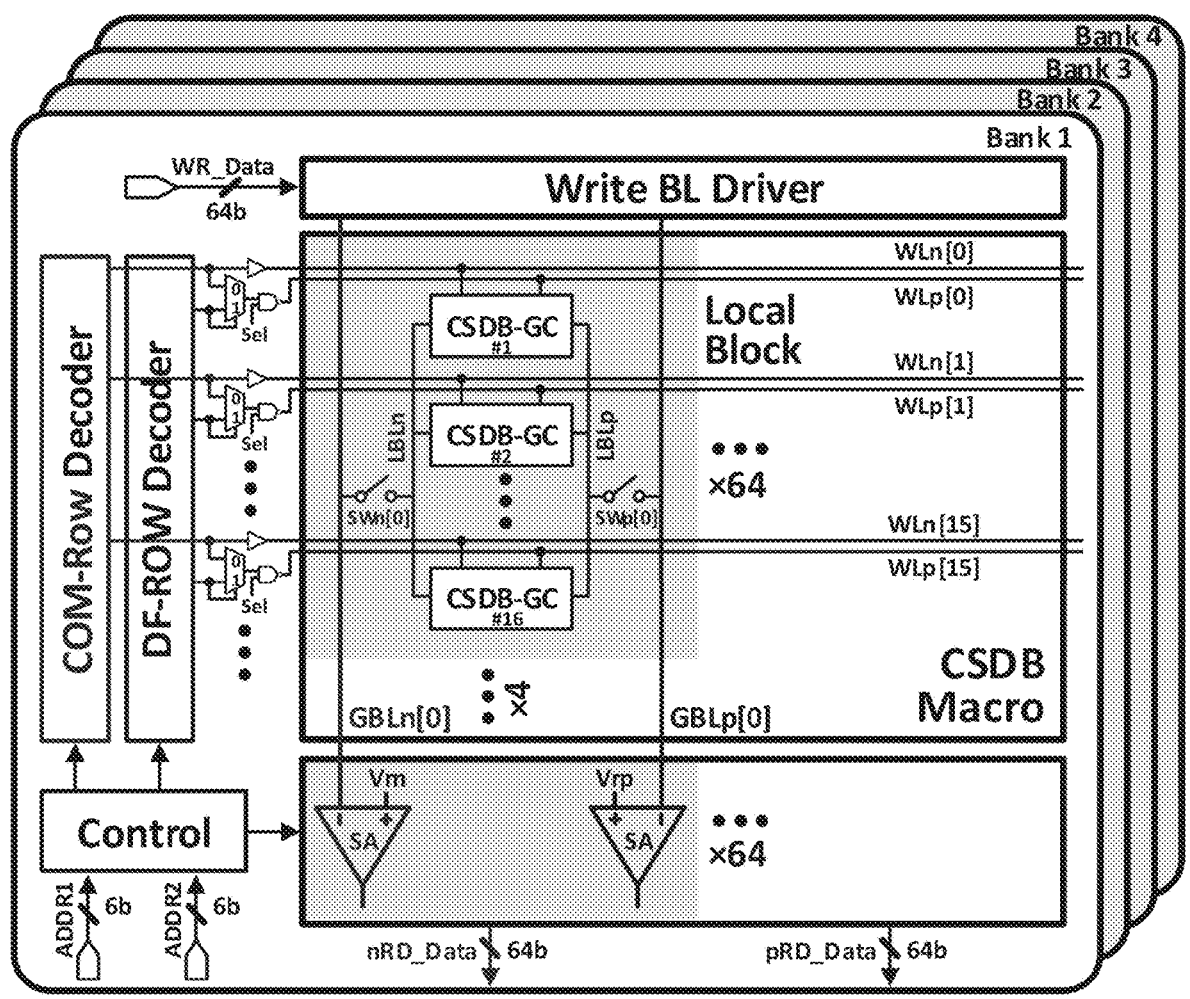
FIG. 1 schematically illustrates an architecture of a chip according to an embodiment, where a CSDB macro includes 64×4 local blocks, and each of the local blocks includes 1×16 CSDB GCs.

As shown in FIG. 1, in the design of the 16 Kb CSDB-eDRAM in this embodiment, a 16 Kb memory array is split into four memory banks (bank 1 to bank 4). Each memory bank includes a CSDB-GC macro module and a corresponding write/read peripheral circuit. Additionally, two address decoders are used to support a single-port/dual-port read operation. One of the two address decoders is a universal address (COM-ROW) decoder, and the other is a different address (DF-ROW) decoder. The DF-ROW decoder is activated only when two different data addresses are received. WLn of an n-type access transistor is directly connected to the COM-ROW decoder, and WLp of a p-type access transistor may be selectively connected to the COM-ROW decoder or the DF-ROW decoder based on control logic. A control block can process up to two 6-bit addresses and generate a corresponding control signal. For example, in this embodiment, selection signal Sel will be pulled up to enable dual-port read and write operations. Each CSDB-GC macro module is constituted by 64×4 local blocks, and each of the local blocks stores 1×16 CSDB-GC cells. Four local blocks in a same column of the CSDB-GC macro module share same GBLn, same GBLp, and two SA modules in each column. In one local block, each CSDB-GC memory cell is connected to LBLn and LBLp, and SWn and SWp that are controlled by two most significant bits of a data address further connect the LBLn and LBLp to GBLn and GBLp respectively. For example, when the two most significant bits are "01", a second local block in a column is selected, and corresponding SWn and SWp are closed to connect LBLn and LBLp of the second local block to the GBLn and the GBLp respectively.

Figures 2A, 2B:
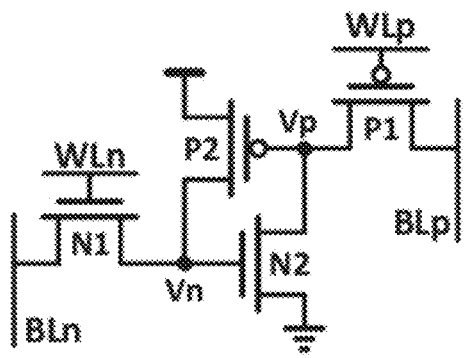
FIG. 2A illustrates a structure of a CSDB-GC.
FIG. 2B illustrates an operating principle.

FIG. 2A shows a design of a 4 T CSDB-GC in this embodiment. The 4 T CSDB-GC includes dual ports that are provided by n-type access transistor N1 and p-type access transistor P1, and an internal data regeneration loop constituted by n-type transistor N2 and p-type transistor P2. BLn connected to the n-type access transistor N1 and BLp connected to the p-type access transistor P1 are respectively connected to the LBLn and the LBLp, and the WLn connected to the n-type access transistor N1 and the WLp connected to the p-type access transistor P1 are connected to the address decoder. FIG. 2B shows detailed signal conditions in different operation modes. For simplicity, '1' is used to represent a VDD and '0' is used to represent a GND. Next, a read/write operation process of the CSDB-GC memory cell is described in detail.

1) Write operation. The 4 T CSDB-GC designed in the present disclosure can still ensure a good write operation and successfully write data without using a wordline voltage boosting technology During the write operation, voltages of the WLn and the WLp are set to '1' and 'O' respectively. For example, in order to store data '0', where Vn='0' and Vp='1', a write driver generates corresponding data and sends the data to a global bitline (GBL). Based on a given address, the data '0' is written to the node Vn through the n-type access transistor N1, and data '1' is written into the node Vp through the p-type access transistor P1 Considering a worst-case scenario of the write operation (namely, an operation of writing '1'), it is difficult for the n-type access transistor N1 to transmit a complete signal '1' to the Vn (the N1 is an NMOS, and can only transmit weak '1' to the Vn, where the weak '1' represents a voltage lower than the VDD), and it is difficult for the p-type access transistor P1 to transmit a complete signal '0' to the Vp (the P1 is a PMOS, and can only transmit weak '0' to the Vp, where the weak '0' represents a voltage higher than the GND). Therefore, based on the internal data regeneration loop, this embodiment implements a compensation mechanism for writing data. Specifically, both the weak '1' and the weak '0' can be used to turn on the n-type transistor N2 and the p-type transistor P2. In this case, the node Vn and the node Vp are also connected to the VDD and the GND respectively, to ultimately store full-swing data. This process is also known as data regeneration. Therefore, in this embodiment, a data compensation mechanism stored in the Vn and the Vp is implemented through a data regeneration loop. As shown in FIG. 2B, a bitline bias scheme is adopted to further extend DRT in a retention mode. A main implementation method is to set voltages of the BLn and the BLp in the retention mode to the GND and the VDD, respectively. A main principle is to reduce leakage of the data '0' stored in the Vn, because the internal data regeneration loop cannot compensate for the data '0' in this case.

2) Read operation. The 4 T CSDB-GC designed in the present disclosure supports the single-port/dual-port read operation to further enhance a data reading bandwidth. The single-port read operation can be implemented through the n-type access transistor N1 or the p-type access transistor P1, and the dual-port read operation needs to be implemented by turning on the n-type access transistor N1 and the p-type access transistor P1 simultaneously.

Herein, a read operation of the n-type access transistor N1 is taken as an example to describe a process of the single-port read operation. A complete operation process is as follows: First, the GBLn is pre-discharged to the GND before a read port is enabled. Next, the corresponding LBLn is connected to the GBLn through a block selection switch. Then, during the read operation, the WLn is charged to V1 to turn on the n-type access transistor N1. If the data '0' is stored in the node Vn, the GBLn remains at the GND during the read operation. In this special case (or the data '1' is stored in the node Vp), the stored data is refreshed again during the read operation, thus avoiding a rewriting process during the refresh operation. If the data '1' is stored in the node Vn, the GBLn is pulled to ΔV, and the data in the node Vn also experiences a small fluctuation.

Figure 2C:
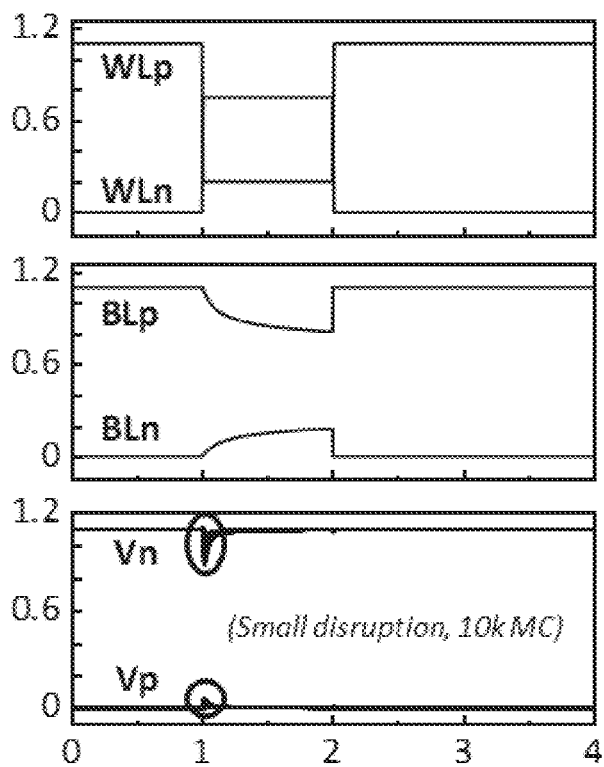
FIG. 2C illustrates transient stability analysis of a dual-port read operation.

A complete process of the dual-port read operation is as follows: First, before the read port is enabled, the GBLn is pre-discharged to the GND and the GBLp is pre-charged to the VDD. Next, the block selection switch is used to connect the corresponding LBLn to the GBLn and the corresponding LBLp to the GBLp. Then, during the read operation, the WLn is charged to the V1 to turn on the n-type access transistor N1, and the WLp is charged to V2 to turn on the p-type access transistor P1. If the data '0' is stored in the node Vn (in this case, the data '1' is stored in the node Vp), the GBLn remains at the GND during the read operation, and the GBLp remains at the VDD. In this case, the stored data is refreshed again during the read operation, thus avoiding the rewriting process during the refresh operation. If the data '1' is stored in the node Vn (in this case, the data '0' is stored in the node Vp), a voltage on the GBLn is raised to the ΔV, and the data in the node Vn also experiences a small fluctuation. Similarly, a voltage on the GBLp decreases from the VDD to VDD-AV. In this case, voltages of the node Vn and the node Vp also experience a small disturbance, as shown in FIG. 2C.

However, when such a disturbance occurs (the voltage of the node Vn experiences a small decrease from a high level, while the voltage of the node Vp experiences a small increase from a low level), although both the node Vn and the node Vp change from their original states, the n-type transistor N2 and the p-type transistor P2 are still turned on. In this way, the node Vn and the node Vp are still connected to the VDD and the GND respectively, such that the voltages of the node Vn and the node Vp will be quickly restored to the VDD and the GND respectively. Due to the existence of such paths (from Vn to VDD and from Vp to GND), the stored data '1' (in other words, Vn=VDD, and Vp=GND) is compensated by the internal regeneration loop without a loss.

In order to avoid an impact of a potential read disturbance of data stored in the CSDB-GC, a wordline voltage off-chip tuning method for the read operation is designed for the single-port/dual-port read operation. This method mainly adjusts the voltages V1 and the V2 of the read wordline during the read operation. In this design, an off-chip adjustable voltage source is used to complete the adjustment of the V1 and the V2. FIG. 2C illustrates transient stability analysis of reading data stored after using this technology. Monte Carlo (MC) simulation analysis at 10,000 points by using a recalibrated cryogenic BSIMs model proves that for a worst-case read operation, in other words, a dual-port '1' reading operation, no data flipping occurs.

Figure 2D:
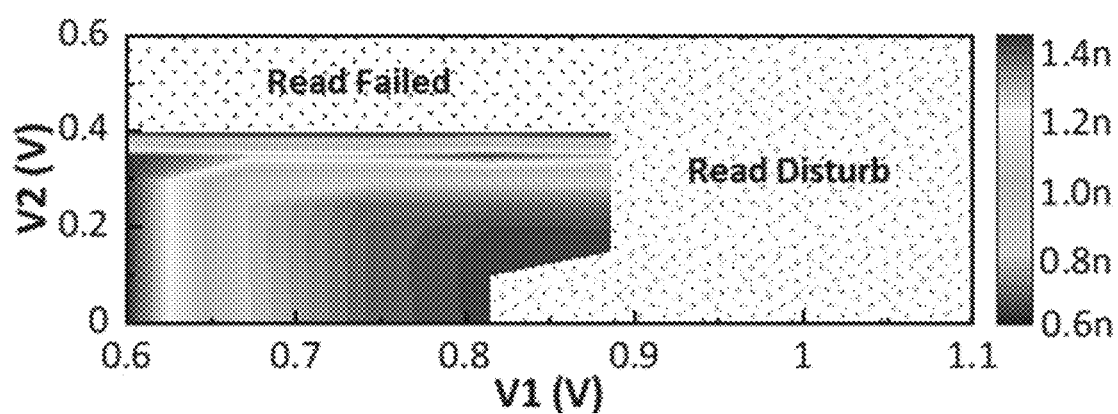
FIG. 2D illustrates a relationship between different tuning methods for a voltage (V1/V2) of a read wordline and a read delay.

In addition, the wordline voltage off-chip tuning technology for the read operation can be further used to reduce an unbalance between reading speeds of the dual ports. A measurement result verifies that this method can significantly improve reading performance. FIG. 2D illustrates an impact of using the wordline voltage off-chip tuning technology for the read operation on access time of the read operation. Under different tuning voltages, the access time of the read operation may range from 610 ps to 1390 ps. In this figure, there are two forbidden regions for reading voltage tuning. In these two regions, the read operation cannot read data normally, and even incorrectly writes data into the CSDB-GC, which are referred to as "read-failed" and "read-disturb" respectively. For a reliable read operation and a performance consideration at the temperature of 4.2 K, the WLn (V1) and the WLp (V2) are set to 0.75 V and 0.2 V respectively in this work.

In order to achieve a cryogenic energy-efficient memory system to meet a requirement for cryogenic and high-performance computing, each memory access (read or write) operation needs to be more energy-efficient as much as possible. In order to further reduce access time and a power consumption overhead of data access, a bitline segmentation scheme is introduced at the temperature of 4.2 K. An important consideration for bitline segmentation is to determine a size of column segmentation when a trade-off is achieved between a speed, a power consumption, and area. Based on the recalibrated cryogenic BSIMs model, impacts of different segmentation sizes on a final result are simulated. In the simulation, different sizes such as 2, 4, 8, and 16 are evaluated, and results show that an optimal solution is to obtain 4 blocks through division in a column, with higher performance, a higher power consumption gain, and a negligible area overhead.

Figure 3:
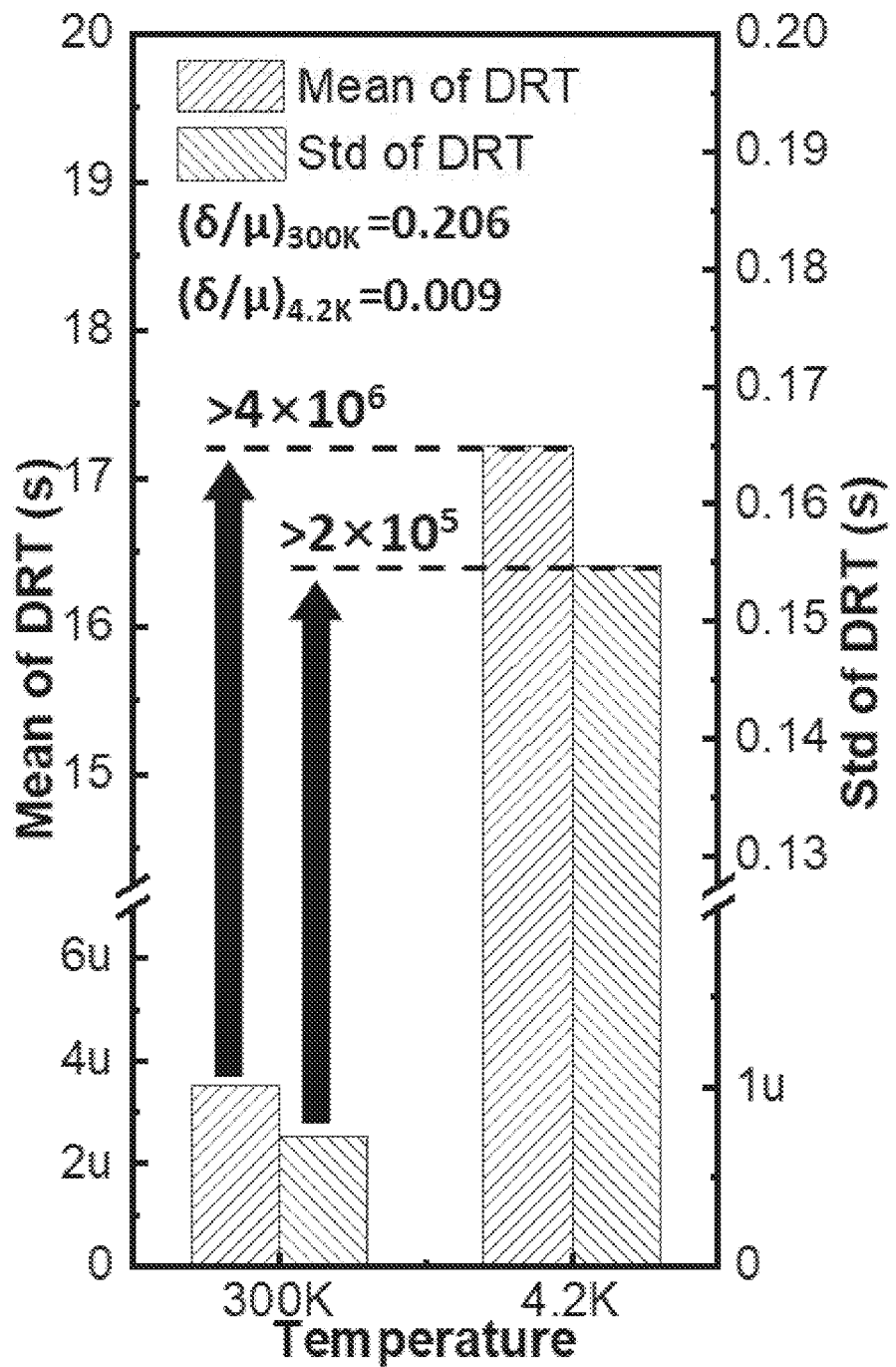
FIG. 3 illustrates a statistical analysis result of DRT.

FIG. 3 illustrates statistical results of DRT of the chip designed in the present disclosure at temperatures of 300K and 4.2 K. It can be seen that the RT is mainly 17.2 seconds at the temperature of 4.2 K, which is about $4\times10^6$ times higher than the RT at the temperature of 300 K. A significant increase in the RT can be attributed to a significant decrease in a leakage current when an operating temperature drops to 4.2 K. In addition, it can also be obtained that a variation coefficient (o/u) of the DRT at a cryogenic temperature also significantly decreases (from 0.206 to 0.009) compared with that at a room temperature. This indicates a smaller change in the DRT and may indicate a lower change in the leakage current.

Figure 4A:
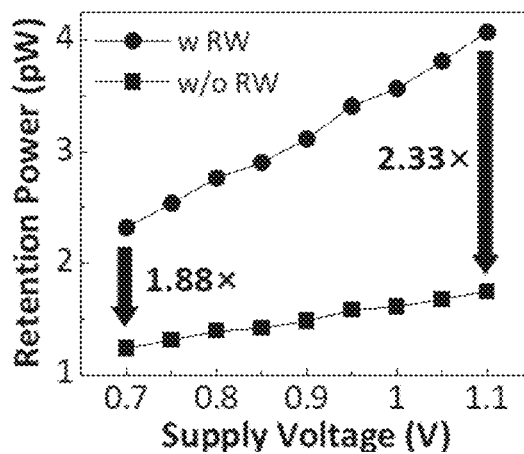
FIG. 4A illustrates a data plot of retention power under different supply voltages.
Figure 4B:
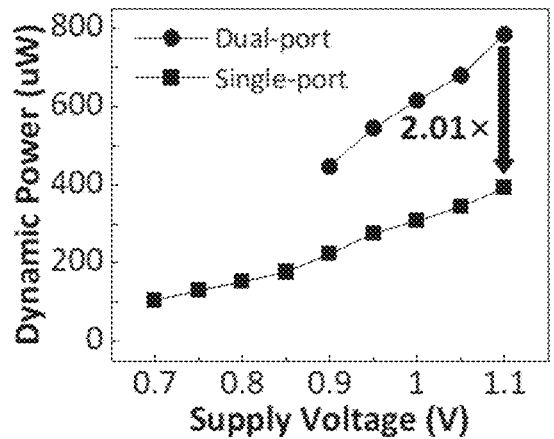
FIG. 4B illustrates a data plot of dynamic power under different supply voltages.
Figure 4C:
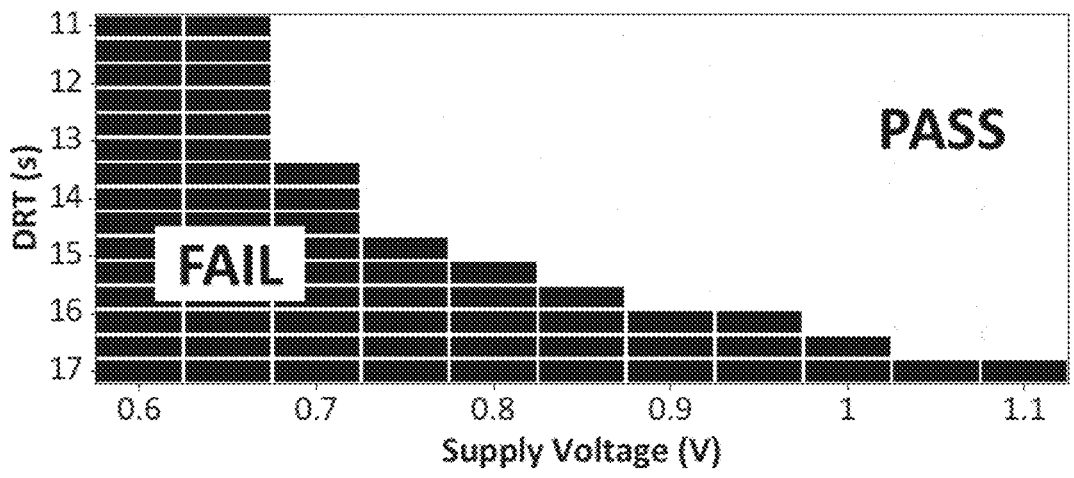
FIG. 4C illustrates a shmoo plot of a supply voltage and DRT.

Unlike a conventional static circuit design, in addition to dynamic and leakage power, retention power (namely, refresh power) of data in the eDRAM design should also be well optimized. FIG. 4A compares retention power of the refresh operation with rewriting (w RW) and the refresh operation without rewriting (w/o RW) under different supply voltages at the temperature of 4.2 K. Owing to a rapid improvement of the leakage current at the cryogenic temperature, the retention power is also greatly reduced. Due to a read operation failure below 0.7 V and a dual-port read failure below 0.9 V, only results of single-port read operations at 0.7 V to 1.1 V are measured. It can be seen that a rewriting operation during the refresh operation almost doubles retention power throughout an entire operating voltage range. FIG. 4B shows dynamic power of different read modes at 0.7 V to 1.1 V. The dual-port read operation only works correctly at 0.9 V to 1.1 V. For a low-bandwidth or low-power application requirement, a single-port read operation mode can be selected. In this mode, a power consumption overhead of the memory is 390 uW, which is about half of that of a dual-port read operation mode. FIG. 4C illustrates a relationship between the DRT and the supply voltage of the CSDB-eDRAM. The CSDB-eDRAM designed in the present disclosure supports a wide range of supply voltages from 0.7 V to 1.1 V and has long DRT. When the VDD is less than 0.7 V, the RT can still be approximate to 14 seconds. However, at 1.1 V, the RT can increase to 16.6 seconds.

Figure 5:
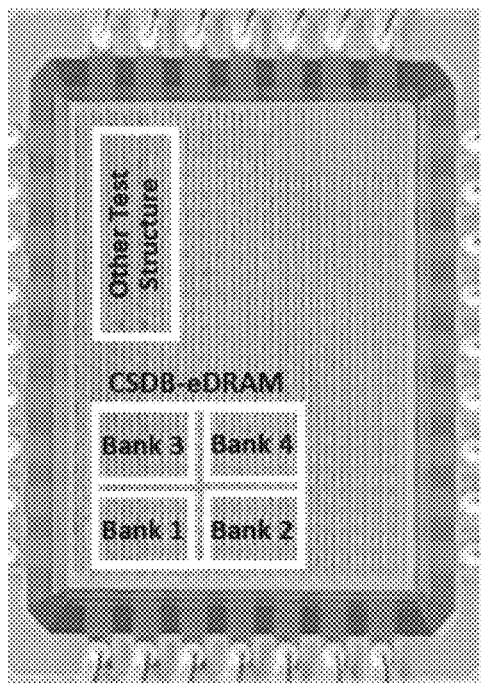
FIG. 5 illustrates a micrograph of a chip and a summary table of main technical parameters of the chip.

FIG. 5 illustrates a photograph and a summary table of the chip of the 16 Kb CSDB-eDRAM. At the temperature of 4.2 K and a supply voltage of 1.1 V, the 16 Kb CSDB-eDRAM achieves DRT of more than 16.67 seconds at a power consumption overhead of 787.68 uW.

FIG. 6 compares the design in the present disclosure and the latest eDRAM research work. Generally, a room-temperature eDRAM design of a single-type access transistor [4]-[6] benefits from less leakage of stored data. However, due to a great increase in a wordline voltage and a risk of reducing a device lifespan, these design structures are not very effective at the cryogenic temperature. The work in the present disclosure achieves optimal results in terms of the dynamic power, the RT, and a frequency at the temperature of 4.2 K. Under same unit area, compared with the state-of-the-art cryogenic 2 T GC research work[3], the design in the present disclosure increases the RT by 2.6 times without incurring an additional overhead of boosting the wordline voltage. In addition, compared with a cryogenic 2 T GC, the design in the present disclosure also reduces the dynamic power by 11.4 times.

A final chip measurement result shows that the 16 Kb CSDB-eDRAM achieves the DRT of 16.67 seconds, which is 2.6 times longer than DRT of a state-of-the-art cryogenic eDRAM[3] at the temperature of 4.2 K, and achieves lower refresh power (0.11 pW/Kb). In addition, the 16 Kb CSDB-eDRAM also achieves shorter access time, namely, 710 ps (1.41 GHz). Compared with the state-of-the-art work, the 16 Kb CSDB-eDRAM has a lowest dynamic power consumption overhead, namely, 49.23 uW/Kb.

What is claimed is:

1. An energy-efficient memory for cryogenic computing, comprising a plurality of memory banks, wherein each of the plurality of memory banks comprises a cryogenic semi-static, dual-port, boost-free gain cell (CSDB-GC) macro module, a universal address decoder, and a different address decoder, wherein the CSDB-GC macro module comprises a plurality of columns of local blocks, wherein all local blocks in a same column share a same global bitline n (GBLn), a same global bitline p (GBLp), and two sense amplifiers (SAs) connected to the GBLn and the GBLp, each of the plurality of columns of local blocks comprises a plurality of CSDB-GC memory cells, all CSDB-GC memory cells of a same local block are connected to a local bitline n (LBLn) and a local bitline p (LBLp), different local blocks have different LBLns and LBLps, each LBLn is connected to the GBLn through a corresponding bitline switch SWn, each LBLp is connected to the GBLp through a corresponding bitline switch SWp, and the SWn and the SWp are controlled to be closed to select a corresponding local block in a column, wherein an LBLn and an LBLp of the selected local block are connected to the GBLn and the GBLp respectively;

a wordline n (WLn) of each of the plurality of CSDB-GC memory cells is directly connected to the universal address decoder, a wordline p (WLp) is selectively connected to the universal address decoder or the different address decoder based on control logic, the different address decoder is activated only when two different data addresses are received, the universal address decoder is activated to implement a single-port read operation of the CSDB-GC memory cell, and the different address decoder is activated to implement a dual-port read operation of the CSDB-GC memory cell; and each of the plurality of CSDB-GC memory cells comprises dual ports provided by a first n-type access transistor and a first p-type access transistor, and an internal data regeneration loop constituted by a second n-type transistor and a second p-type transistor, a bitline n (BLn) connected to the first n-type access transistor and a bitline p (BLp) connected to the first p-type access transistor are respectively connected to the LBLn and the LBLp, the WLn is connected to the first n-type access transistor, and the WLp is connected to the first p-type access transistor;

during a write operation, data 0 or 1 is written into a node Vn through the first n-type access transistor, and the data 1 or 0 is written into a node Vp through the first p-type access transistor;

when the first n-type access transistor transmits a weak signal '1' to the node Vn or the first p-type access transistor transmits a weak signal '0' to the node Vp, the weak signal '1' or the weak signal '0' enables the second n-type transistor and the second p-type transistor to be turned on, the node Vn is connected to a VDD through the second p-type transistor, and the node Vp is connected to a GND through the second n-type transistor, wherein the weak signal '1' represents a voltage lower than the VDD and the weak signal '0' represents a voltage higher than the GND; and during a read operation, the first n-type access transistor and/or the first p-type access transistor are/is turned on to read data stored in the node Vn and/or the node Vp, and when voltages of the node Vn and the node Vp experience a disturbance, the second n-type transistor and the second p-type transistor are turned on, allowing the node Vn and the node Vp to be connected to the VDD and the GND respectively.

2. The energy-efficient memory for cryogenic computing according to claim 1, wherein statuses of the bitline switches SWn and SWp are controlled through two most significant bits of a data address, wherein a corresponding local block in a column is selected.

3. The energy-efficient memory for cryogenic computing according to claim 1, wherein voltages of the BLn and the BLp in a retention mode are set to the GND and the VDD, respectively.

4. The energy-efficient memory for cryogenic computing according to claim 1, wherein during the read operation, the WLn is charged to a V1 to turn on the first n-type access transistor, the WLp is charged to a V2 to turn on the first p-type access transistor, and the voltages V1 and V2 of the WLn and WLp are adjusted during the read operation to achieve a wordline voltage off-chip tuning for the read operation.

* * * * *